United States Patent
Ohlhoff

(10) Patent No.: US 6,504,394 B2
(45) Date of Patent: Jan. 7, 2003

(54) CONFIGURATION FOR TRIMMING REFERENCE VOLTAGES IN SEMICONDUCTOR CHIPS, IN PARTICULAR SEMICONDUCTOR MEMORIES

(75) Inventor: Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/737,057

(22) Filed: Dec. 14, 2000

(65) Prior Publication Data

US 2001/0004126 A1 Jun. 21, 2001

(30) Foreign Application Priority Data

Dec. 14, 1999 (DE) .......................................... 199 60 244

(51) Int. Cl.$^7$ ...................... G01R 31/26; G01R 31/02; G01N 27/416
(52) U.S. Cl. ...................... 324/765; 324/427; 324/763
(58) Field of Search ................................ 324/765, 763, 324/427, 426; 714/733, 734, 735

(56) References Cited

U.S. PATENT DOCUMENTS

| 5,319,370 A | * | 6/1994 | Signore et al. ............. 341/120 |
| 5,631,537 A | * | 5/1997 | Armstrong .................. 324/427 |
| 6,087,889 A | | 7/2000 | Mok |
| 6,118,384 A | * | 9/2000 | Sheldon et al. ............. 324/427 |

FOREIGN PATENT DOCUMENTS

| DE | 196 41 857 A1 | 4/1997 | |
| JP | 20012166040 A | * 8/2001 | ........... H01L/27/04 |

* cited by examiner

Primary Examiner—Michael Sherry
Assistant Examiner—Jermele Hollington
(74) Attorney, Agent, or Firm—Laurence A. Greenberg; Werner H. Stemer; Ralph E. Locher

(57) ABSTRACT

A circuit configuration for trimming reference voltages in semiconductor chips. The circuit configuration contains a test logic unit and a trimming circuit for trimming at the chip level the reference voltages. The reference voltages are compared to an externally supplied comparison voltage and the reference voltage is varied by the trimming circuit if it does not match the comparison voltage.

8 Claims, 1 Drawing Sheet

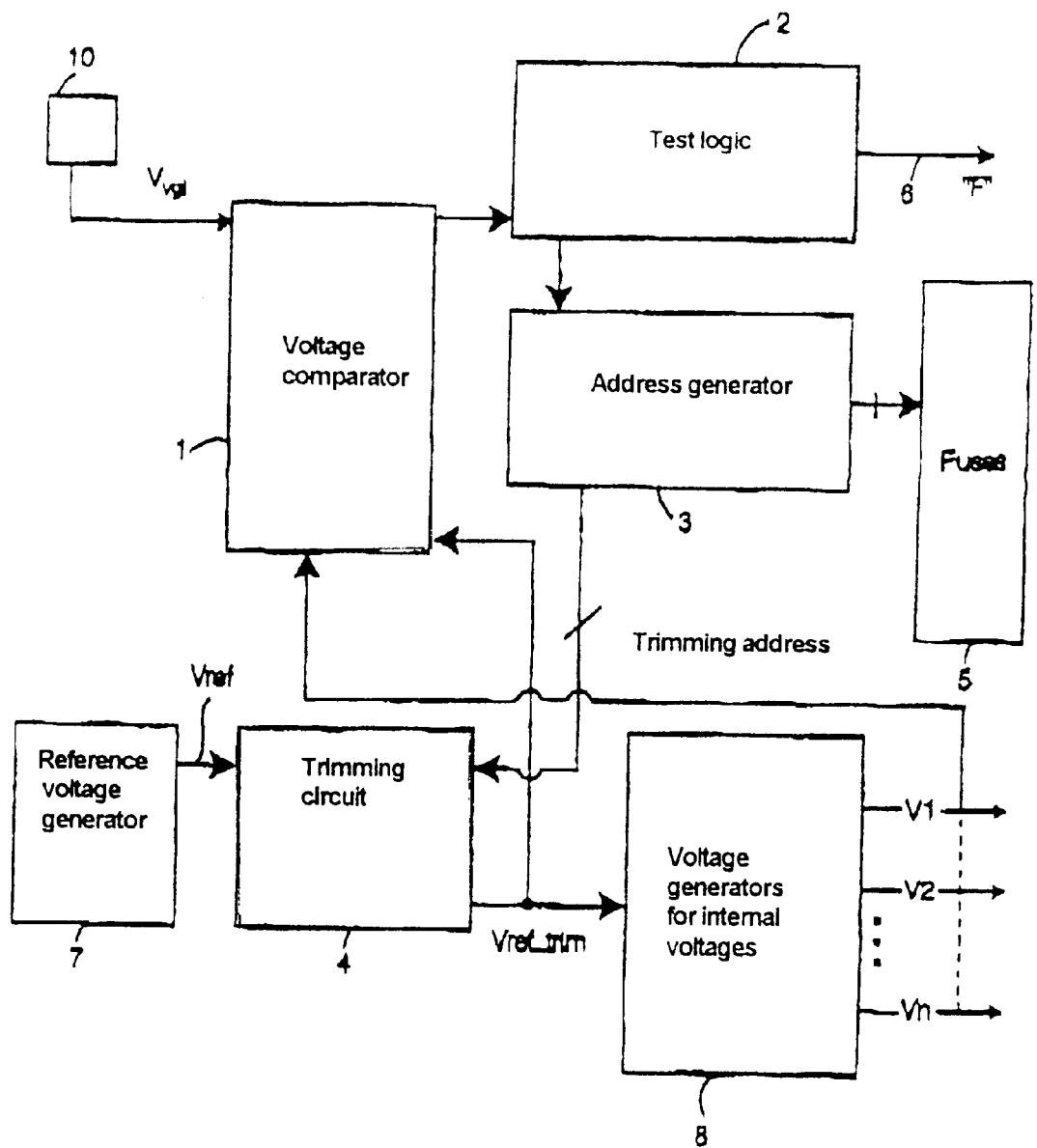

CONFIGURATION FOR TRIMMING REFERENCE VOLTAGES IN SEMICONDUCTOR CHIPS, IN PARTICULAR SEMICONDUCTOR MEMORIES

BACKGROUND OF THE INVENTION

FIELD OF THE INVENTION

The present invention relates to a configuration for trimming reference voltages which are produced in semiconductor chips that are provided in a semiconductor wafer. In the configuration, the reference voltages are compared in a test program with an externally supplied voltage, and correction information is used to match them to the external voltage as a respective nominal value of the reference voltages, which is the same for all the semiconductor chips in the semiconductor wafer. Such a configuration is known from Published, Non-Prosecuted German Patent Application DE 196 41 857 A1 (which corresponds to U.S. Pat. No. 6,087,889).

Semiconductor chips, or integrated circuits produced in semiconductor chips, often require regulated internal voltages to prevent their operation from being sensitive to fluctuations in external voltage supplies. The voltage regulation is in this case preferably carried out with the aid of a reference voltage that is produced internally and has a particularly low sensitivity to temperature.

Owing to the parameter fluctuations that are virtually always present in the manufacture of semiconductor chips, such as diffusion temperatures etc., the reference voltage values have a certain distribution range, which cannot be ignored, in finished semiconductor chips. In order to keep this distribution range as small as possible and in order to produce an identical reference voltage, and/or. identical internal voltages, for all the semiconductor chips, the reference voltage is trimmed in a test program, which is also used to check the operability of the semiconductor chip. In order to allow this, the semiconductor chip is provided with appropriate logic to convert correction information, which can be stored in laser fuses, into a voltage change.

Semiconductor chips and, in particular, semiconductor memories are at the moment preferably intensively tested at the wafer level, which is more cost-effective than testing at the chip level. The trimming is in this case carried out in such a way that the voltage to be trimmed is measured, and a chip-specific correction address is then calculated on the basis of the measured value obtained in this way. If necessary, the correction value obtained by use of the correction address in this way can then be programmed into the semiconductor chip via special test modes, so that the value obtained in this way can then be corrected once again in a further trimming step. However, such trimming is relatively time-consuming and must be carried out separately for each semiconductor chip.

Furthermore, the following must also be kept in mind. While functional tests for a number of semiconductor chips can be carried out in parallel, the test time for trimming cannot be reduced by increasing the parallelity. As the parallelity for wafer tests becomes ever greater, this leads to the proportion of the test time that is required for trimming becoming ever greater. In particular, in the case of full-wafer tests, which are a future configuration aim, that is to say for parallel testing of an entire wafer, it is impossible to prevent the test time from being lengthened, thus increasing the costs.

At the moment, semiconductor chips are trimmed serially. In the process, for example, a conventional test program can run in parallel for n semiconductor chips, with n having the value 16, for example. Contact is made with the semiconductor chips in parallel, using special needle (probe) cards. For any subsequent trimming step, (n−1) semiconductor chips are then, for example, masked out in each case, and a correction address is determined for the respectively remaining semiconductor chip. The trimming is in this way carried out serially for all n semiconductor chips, which involves a considerable time penalty.

SUMMARY OF THE INVENTION

It is accordingly an object of the invention to provide a configuration for trimming reference voltages in semiconductor chips, in particular semiconductor memories which overcomes the above-mentioned disadvantages of the prior art devices, which allows the trimming of reference voltages in semiconductor chips to be carried out quickly and cost-effectively.

With the foregoing and other objects in view there is provided, in accordance with the invention, a semiconductor chip having a circuit configuration for trimming a reference voltage produced by the semiconductor chip. The circuit configuration contains a trimming circuit that receives the reference voltage. A voltage comparator is connected to the trimming circuit and receives the reference voltage. The voltage comparator compares the reference voltage with an externally supplied test voltage resulting in the voltage comparator outputting a comparison signal. A test logic unit is connected downstream from the voltage comparator and to the trimming circuit. The test logic unit receives and evaluates the comparison signal and generates corrective information received by the trimming circuit if the reference voltage and the test voltage do not match, and the trimming circuit uses the corrective information for changing the reference voltage.

For the configuration of the type mentioned initially, the object is achieved according to the invention by the test logic unit, which is provided on each semiconductor chip and is connected downstream from the voltage comparator. The voltage comparator is provided in the semiconductor chip and compares the externally supplied voltage with the reference voltage which is supplied from, and is varied by, a trimming circuit.

The configuration according to the invention thus allows the trimming of the reference voltages to be moved from a test set directly onto the semiconductor chip to be trimmed, and this has considerable associated advantages.

First, the time, and thus the test costs as well, required for trimming are considerably reduced, with the saving becoming greater the greater the number of semiconductor chips which are tested in parallel using the configuration according to the invention. Since there is no longer any need for an external test set, there is no need for direct-current voltage measurement units either, and this is of particular importance for high parallelity. Specifically, with some test sets, the maximum number of such voltage measurement units available is less than the number of semiconductor chips to be tested in parallel. The test program to be carried out by the configuration is simplified, since this allows all the semiconductor chips to be tested in parallel.

Large-scale-integrated circuits in semiconductor chips should preferably be subjected to a self-test program in which only a limited number of external control signals are still required and provided for monitoring a test sequence. In contrast to the situation with iterative trimming, the configuration according to the invention results in that no correction addresses be transferred to a semiconductor chip. However, self-trimming is a necessary supplement for any far-reaching self-test strategy in which the interface to the semiconductor chip is reduced to such a great extent that it is no longer possible to transfer correction addresses.

The configuration according to the invention now requires an external test set only to provide a comparison voltage, so that one line to, or one contact with, a test probe of this test set is sufficient. This represents a considerable simplification in comparison to conventional configurations, in which a separate line to each of the n semiconductor chips with which parallel contact is made is required for voltage measurement.

The essential feature of the present invention is thus that the trimming is carried out by a special configuration on the semiconductor chip to be trimmed. In the process, a steady-state comparison voltage is applied to each semiconductor chip by an external voltage source, which is present in an external test set. The configuration according to the invention then automatically trims the trimmable internal voltages to the externally applied steady-state comparison voltage, on the semiconductor chip. Information required for trimming, the so-called trimming information, that is to say in particular correction addresses, is stored on the individual semiconductor chip, for example with the aid of electrical fuses or anti-fuses. However, it is also likewise possible to transmit the trimming information to a test set and then to fire laser fuses or other fuses.

In accordance with an added feature of the invention, an address generator is connected between the test logic unit and the trimming circuit.

In accordance with an additional feature of the invention, a voltage generator for generating internal voltages is connected downstream from the trimming circuit.

In accordance with another feature of the invention, electrical fuses are connected to the address generator and store addresses of the trimming circuit if the reference voltage and the test voltage match.

With the foregoing and other objects in view there is further provided, in accordance with the invention, a wafer having a plurality of semiconductor chips. A circuit configuration is disposed in each of the semiconductor chips for trimming a reference voltage produced by a respective semiconductor chip. The circuit configuration contains a trimming circuit that receives the reference voltage. A voltage comparator is connected to the trimming circuit and receives the reference voltage. The voltage comparator compares the reference voltage with an externally supplied test voltage resulting in the voltage comparator outputting a comparison signal. A test logic unit is connected downstream from the voltage comparator and to the trimming circuit. The test logic unit receives and evaluates the comparison signal and generates corrective information received by the trimming circuit if the reference voltage and the test voltage do not match, and the trimming circuit uses the corrective information for changing the reference voltage.

Other features which are considered as characteristic for the invention are set forth in the appended claims.

Although the invention is illustrated and described herein as embodied in a configuration for trimming reference voltages in semiconductor chips, in particular semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block diagram of a configuration according to the invention.

DESCRIPTION OF THE PREFERRED EMBODIMENTS

Voltage-regulated semiconductor chips generally have a central, temperature-stable, internal reference voltage, which is supplied from a reference voltage generator. For production reasons, the reference voltage is initially scattered about a nominal value, which is governed by the configuration of the semiconductor chip, on an untrimmed semiconductor chip.

Referring now to the single FIGURE of the drawing in detail, there is shown a configuration according to the invention in a semiconductor chip with a reference voltage generator 7, which emits a constant reference voltage Vref from which a trimming circuit 4 produces a changed reference voltage Vref_trim.

In order now to allow the reference voltage Vref to be trimmed on the semiconductor chip itself, the configuration according to the invention results in an external comparison voltage Vvgl being applied to the semiconductor chip via, for example, a probe needle, which makes contact with a pad or contact cushion 10 on the semiconductor chip and has the necessary accuracy. The external comparison voltage Vvgl is supplied from the pad 10 to a voltage comparator 1, which compares the comparison voltage Vvgl with the changed reference voltage Vref_trim or with a suitable voltage (V1, V2, . . . Vn) produced in voltage generators 8 from the changed reference voltage Vref_trim.

Depending on the comparison result in the voltage comparator 1, a test logic unit 2 and an address generator 3 control the trimming circuit 4 which, for example, contains a voltage divider in which resistors can be added and removed, so that the trimming circuit 4 supplies a reference voltage Vref_trim which differs from the constant reference voltage Vref. This trimming is carried out, for example, in such a way that the address generator 3 applies all the possible addresses successively to the trimming circuit 4, so that the changed reference voltage Vref_trim is adjusted in specific voltage intervals.

The changed reference voltage Vref_trim is then once again compared with the external comparison voltage Vvgl in the voltage comparator 1. The result of this comparison is transmitted to the test logic unit 2.

If the comparison in the voltage comparator 1, which is evaluated by the test logic unit 2, indicates the changed reference voltage Vref_trim and the external comparison voltage Vvgl do not match in the course of the voltage intervals governed by the trimming circuit 4, then the address generator 3 applies the next trimming address to the trimming circuit 4. One possible way to carry out this comparison is to form the difference between the changed reference voltage Vref_trim and the comparison voltage Vvgl. If a change in the mathematical sign of the difference is detected, then the two voltages match with an error governed by the trimming steps. This process is repeated until the comparison in the voltage comparator 1, which is evaluated in the test logic 2, indicates that the sought match has been found and that all the possible voltage steps from the changed reference voltage Vref_trim which are emitted by the trimming circuit have been checked.

When the voltage comparator 1 or the test logic unit 2 finds a match between the external comparison voltage Vvgl and the changed reference voltage Vref_trim, then the relevant address which produces the match is stored, from the address generator 3, in electrical fuses 5.

Alternatively, such addresses can also be stored in a register, from which the external test set which applies the comparison voltage Vvgl to the pad 10 reads the specific correction address for that semiconductor chip at some later time. The correction address can then once again be stored on the semiconductor chip, for example by use of laser fuses. In this way, it is possible to obtain a changed reference voltage Vref_trim which is largely identical to a predetermined value, so that the voltage generators 8 for internal voltages can use this to produce the desired, regulated internal voltages V1, V2, . . . Vn.

If it is impossible to produce any match between the external comparison voltage Vvgl and the changed reference voltage Vref_trim supplied from the trimming circuit 4, then the test logic unit 2 can mark that semiconductor chip, at an output 6, as a "failure" F, by producing an appropriate signal and, possibly, changing to BIST logic (BIST =Built-in-self-test). The information about the success or failure of the trimming process thus need not necessarily be transmitted immediately to an external test set but, if required, can also be passed on to any BIST logic which may be present.

I claim:

1. In a semiconductor chip, a circuit configuration for trimming a reference voltage produced by the semiconductor chip in reference to a comparison voltage, the circuit configuration comprising:
   a trimming circuit receiving the reference voltage and outputting a trimmed reference voltage if said trimming circuit receives a corrective information;
   a voltage comparator connected to said trimming circuit and receiving the trimmed reference voltage, said voltage comparator comparing the trimmed reference voltage with the comparison voltage resulting in said voltage comparator outputting a comparison signal; and
   a test logic unit connected to said voltage comparator and to said trimming circuit, said test logic unit receiving and evaluating the comparison signal and generating the corrective information received by said trimming circuit if the trimmed reference voltage and the comparison voltage do not match.

2. The circuit configuration according to claim 1, including a voltage generator for generating internal voltages and connected downstream from said trimming circuit.

3. The circuit configuration according to claim 1, including an address generator connected between said test logic unit and said trimming circuit.

4. The circuit configuration according to claim 3, including electrical fuses connected to said address generator and storing addresses of said trimming circuit if the reference voltage and the test voltage match.

5. On a wafer having a plurality of semiconductor chips, a circuit configuration disposed in each of said semiconductor chips for trimming a reference voltage produced by a respective semiconductor chip in reference to a comparison voltage, the circuit configuration comprising:
   a trimming circuit receiving the reference voltage and outputting a trimmed reference voltage if said trimming circuit receives a corrective information;
   a voltage comparator connected to said trimming circuit and receiving the trimmed reference voltage, said voltage comparator comparing the trimmed reference voltage with the comparison voltage resulting in said voltage comparator outputting a comparison signal; and
   a test logic unit connected to said voltage comparator and to said trimming circuit, said test logic unit receiving and evaluating the comparison signal and generating the corrective information received by said trimming circuit if the trimmed reference voltage and the comparison voltage do not match.

6. The circuit configuration according to claim 5, including a voltage generator for generating internal voltages and connected downstream from said trimming circuit.

7. The circuit configuration according to claim 5, including an address generator connected between said test logic unit and said trimming circuit.

8. The circuit configuration according to claim 7, including electrical fuses connected to said address generator and storing addresses of said trimming circuit if the reference voltage and the test voltage match.

* * * * *